United States Patent
Tanaka (10) Patent No.: US 10,444,641 B2
(45) Date of Patent: Oct. 15, 2019

(54) HOLDING DEVICE, TRANSPORT DEVICE, LITHOGRAPHIC APPARATUS, AND ARTICLE MANUFACTURING METHOD

(71) Applicant: CANON KABUSHIKI KAISHA, Tokyo (JP)

(72) Inventor: Hideo Tanaka, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/602,211

(22) Filed: May 23, 2017

(65) Prior Publication Data

US 2017/0351186 A1 Dec. 7, 2017

(30) Foreign Application Priority Data

Jun. 1, 2016 (JP) ................................. 2016-109634

(51) Int. Cl.
G03F 7/20 (2006.01)

(52) U.S. Cl.
CPC .................. *G03F 7/70716* (2013.01)

(58) Field of Classification Search
CPC .................................................. G03F 7/70716
See application file for complete search history.

(56) References Cited

U.S. PATENT DOCUMENTS

| | | | | |
|---|---|---|---|---|
| 5,191,218 A * | 3/1993 | Mori | ...................... | G03F 7/707 250/453.11 |
| 6,454,517 B1 * | 9/2002 | Ohno | .................. | H01L 21/6838 294/188 |
| 6,942,265 B1 * | 9/2005 | Boyd | ................ | H01L 21/67742 294/189 |
| 7,384,083 B2 * | 6/2008 | Kent | .................. | H01L 21/67126 294/213 |
| 8,454,068 B2 * | 6/2013 | Hashimoto | .............. | B25J 15/00 294/103.1 |
| 8,864,202 B1 * | 10/2014 | Schrameyer | ...... | H01L 21/68707 294/213 |
| 9,754,812 B2 * | 9/2017 | Ben-Natan | .......... | H01L 21/6838 |
| 2001/0033369 A1 | 10/2001 | Matsui | | |
| 2002/0041102 A1 * | 4/2002 | Krauskopf | ........ | H01L 21/68707 294/213 |

(Continued)

FOREIGN PATENT DOCUMENTS

| JP | H07125657 A | 5/1995 |
|---|---|---|
| JP | H07289129 A | 11/1995 |

(Continued)

OTHER PUBLICATIONS

Office Action issued in Taiwanese Appln. No. 106117678 dated Mar. 16, 2018. English Translation provided.

*Primary Examiner* — Deoram Persaud
(74) *Attorney, Agent, or Firm* — Rossi, Kimms & McDowell LLP (57) ABSTRACT

A holding device for holding a substrate includes a base including an intake hole and an exhaust flow path communicating with the intake hole, a moving member which is movable in a gravity direction by coming into contact with a substrate, and a determination unit configured to determine whether a moving member holds a substrate on the basis of changes in pressure of the exhaust flow path exhausted by an exhaust unit.

16 Claims, 7 Drawing Sheets

(56) References Cited

U.S. PATENT DOCUMENTS

| | | | | |
|---|---|---|---|---|
| 2010/0034625 A1* | 2/2010 | Kim | ........................ | B23Q 7/04 |
| | | | | 414/226.01 |
| 2015/0146187 A1* | 5/2015 | Toyomaki | ........... | G03F 7/70733 |
| | | | | 355/72 |
| 2017/0277039 A1* | 9/2017 | Kawahara | ............. | G03F 7/7085 |

FOREIGN PATENT DOCUMENTS

| | | | |
|---|---|---|---|
| JP | 2000195926 A | 7/2000 | |
| TW | 201523766 A | 6/2015 | |
| TW | 201543605 A | 11/2015 | |

\* cited by examiner

HOLDING DEVICE, TRANSPORT DEVICE, LITHOGRAPHIC APPARATUS, AND ARTICLE MANUFACTURING METHOD

BACKGROUND OF THE INVENTION

Field of the Invention

The present invention relates to a holding device, a transport device, a lithographic apparatus, and an article manufacturing method.

Description of the Related Art

There is a transport device which transports a substrate to a lithographic apparatus for manufacturing semiconductor devices and the like from the outside of the apparatus. The transport device includes, for example, a holding portion which holds a substrate and a drive portion which drives the holding portion. The drive portion moves the holding portion on which a substrate is held to the inside of the device (a substrate stage and the like) after a placement of the substrate on the holding portion is detected (a load presence detection). The substrate is held by vacuum adsorption which exhausts gas between the holding portion and the substrate using, for example, a mechanism which includes an adsorption hole provided in the holding portion, an exhaust flow path connected to the adsorption hole, and an exhaust unit connected to the exhaust flow path (Japanese Patent Laid-Open No. 2000-195926).

The load presence detection is performed on the basis of changes in pressure in the exhaust flow path, which is caused by, for example, the adsorption hole being closed by the substrate, and there can be erroneous load presence detection when the adsorption hole is insufficiently closed due to a shape (a concavity and convexity, warpage, a hole, and the like) of a substrate in the technology disclosed in Japanese Patent Laid-Open No. 2000-195926. This is because an amount of change in an adsorption pressure force value before and after adsorption can be small if there is a hole in an adsorption surface of the substrate.

SUMMARY OF THE INVENTION

The present invention provides, for example, a transport device which is capable of detecting load presence regardless of the shape of a substrate.

A holding device of the present invention is a holding device which holds a substrate, and includes a base including an intake hole and an exhaust flow path communicating with the intake hole, a moving member which is movable in a gravity direction by coming into contact with the substrate, and a determination unit configured to determine whether the moving member holds the substrate on the basis of changes in pressure of the exhaust flow path exhausted by an exhaust unit.

Further features of the present invention will become apparent from the following description of exemplary embodiments with reference to the attached drawings.

DESCRIPTION OF THE EMBODIMENTS

Hereinafter, embodiments for carrying out the present invention will be described with reference to drawings and the like.

(First Embodiment)

Figure 1:
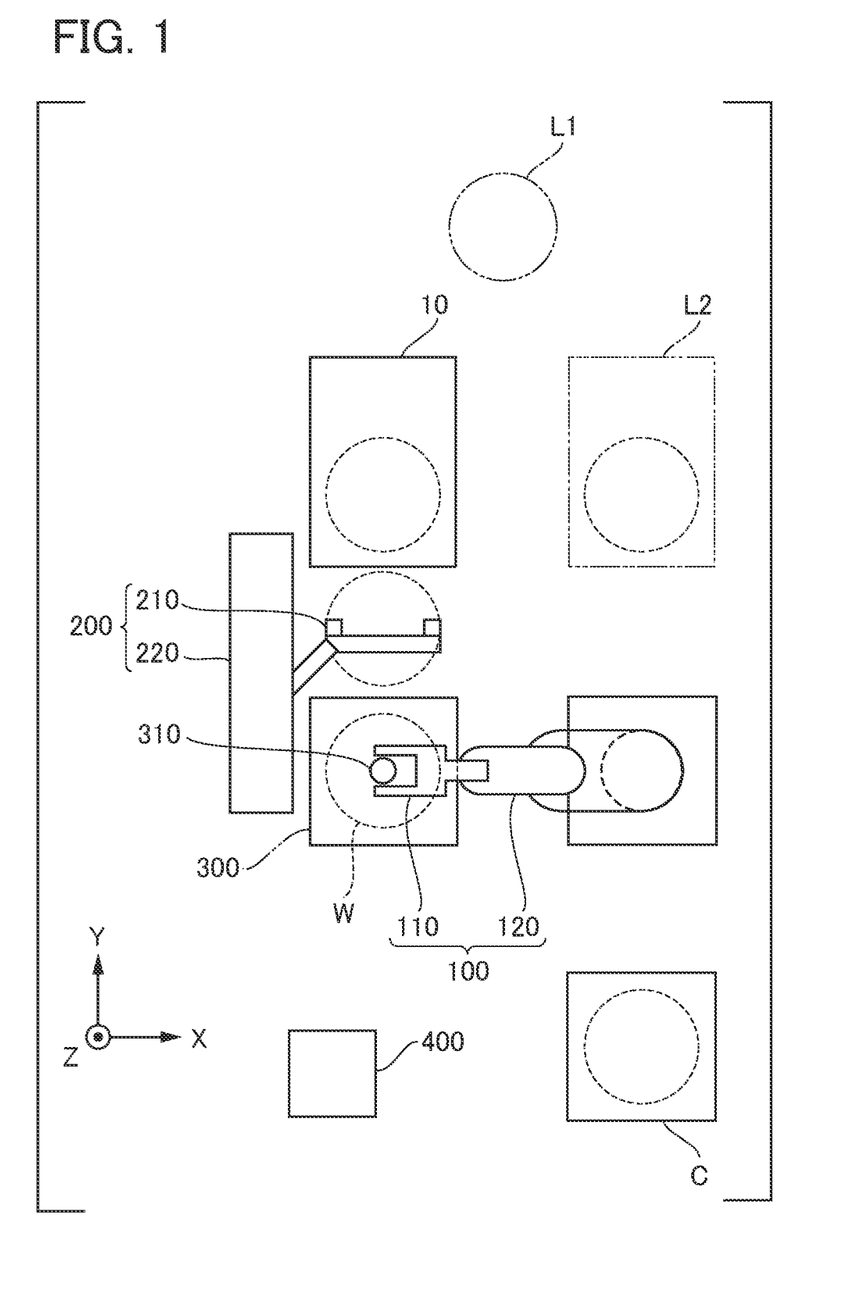
FIG. 1 is a schematic diagram of a transport system which includes a transport device according to a first embodiment.

FIG. 1 is a schematic diagram of a transport system which includes a transport device according to a first embodiment of the present invention. In the present embodiment, an example in which the transport system is applied to an exposure apparatus is described, but the transport system can also be applied to other lithographic apparatuses (for example, an imprint apparatus for forming a pattern on a substrate using a mold). The transport system including the transport device according to the present embodiment includes a first transport device 100, a second transport device 200, a pre-alignment unit 300, and a controller (a determination unit) 400. The transport system transports a substrate W to a stage 10 included in the exposure apparatus. The stage 10 holds the substrate W and drives it toward an exposure position at which the substrate W is exposed. An optical axis of light for curing a photosensitizer (a resist) on the substrate W is set as a Z axis, and a plane perpendicular to the Z axis is set as an XY plane.

The first transport device 100 has a holding portion (a hand, or a holding device) 110 which holds the substrate W and a drive portion (an arm) 120. The first transport device 100 transports the substrate W from a cassette C in which a plurality of substrates W are accommodated in each lot to the pre-alignment unit 300. The substrate W is indicated by a dotted circle in a drawing. The pre-alignment unit 300 holds the transported substrate W using the holding portion 310 and performs pre-processing such as alignment. The second transport device 200 has a holding portion 210 and a drive portion 220, and transports the aligned substrate W to the stage 10. After the substrate W is transported to the stage 10 (a carry-in position), the stage 10 moves so that the substrate W overlaps an exposure position L1 indicated by a two-dot chain line circle, and the substrate W is exposed.

After performing exposure processing, the stage 10 moves to a carry-out position L2. The first transport device 100 transports the substrate W placed on the stage 10 which is at the carry-out position to the cassette. The controller 400 controls the first transport device 100, the second transport device 200, and the pre-alignment unit 300 to hold, transport, and align the substrate W. Moreover, the controller 400 may also perform driving of the stage 10 or a control of the exposure processing. The holding portion 110 of the first transport device 100 and the holding portion 310 of the pre-alignment unit 300 are configured to hold different surfaces of the substrate W. In addition, the transportation of the substrate W to the stage 10 from the pre-alignment unit 300 may also be performed by the first transport device 100 instead of the second transport device 200.

Figure 2A:
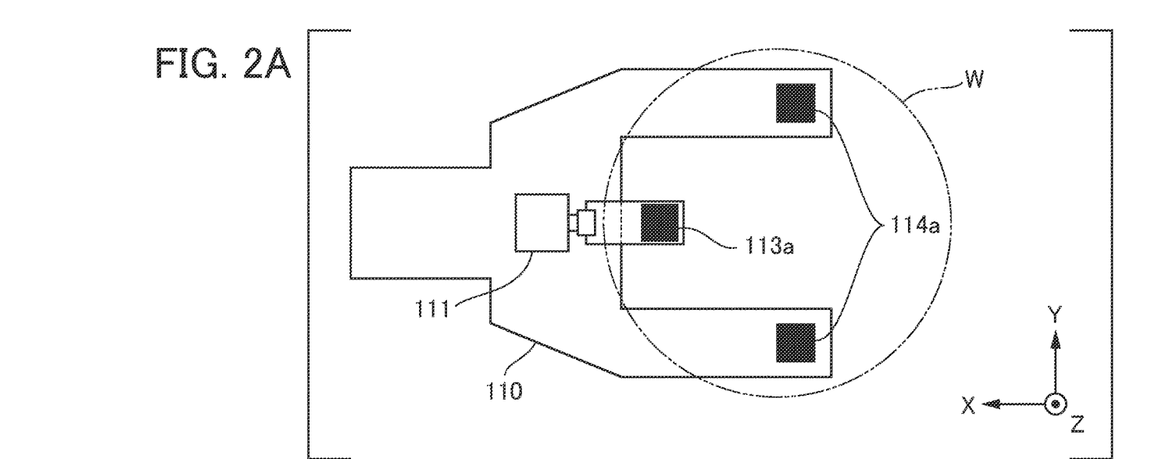
FIG. 2A is a schematic diagram of the transport device according to the first embodiment, which is a view from an upper surface of a substrate (a Z direction).
Figure 2B:
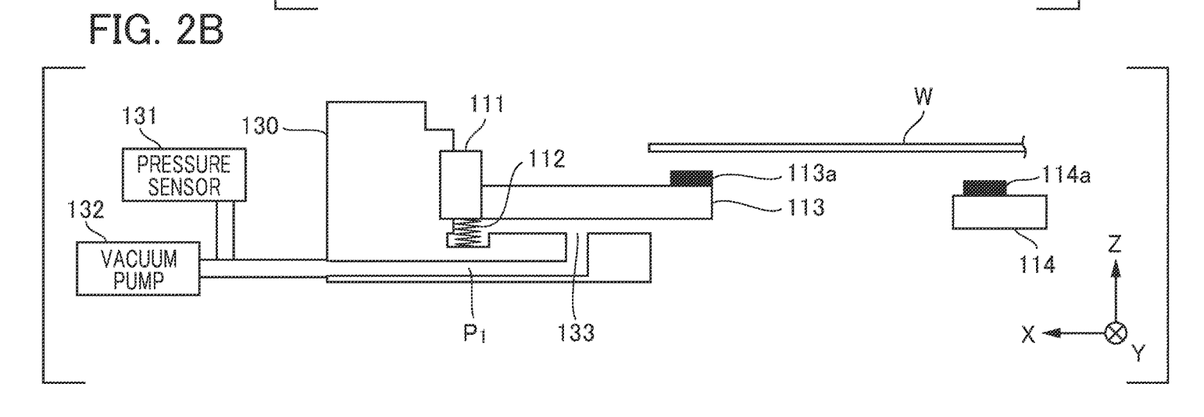
FIG. 2B is a schematic diagram of the transport device according to the first embodiment, which is a view from a side surface of the substrate (a Y direction).

FIGS. 2A and 2B are schematic diagrams which show a portion of a configuration of the transport device according to the first embodiment of the present invention. FIG. 2A is a schematic diagram of the first transport device 100 which is viewed from an upper surface of the substrate W (a Z direction), and FIG. 2B is a schematic diagram which is a view from a side surface of the substrate W (a Y direction). The transport device 100 includes a base 130 in addition to the holding portion 110 and the drive portion 120 which are described above. The holding portion 110 includes a guide portion 111, an elastic portion 112, a first support portion 113, and a second support portion 114. The first support portion 113 and the second support portion 114 respectively include a first contact portion 113$a$ and a second contact portion 114$a$, which are portions for holding the substrate W. The first contact portion 113$a$ and the second contact portion 114$a$ come into contact with a back surface of the substrate W and hold the substrate W using frictional force. The first support portion 113 is a moving member which moves in a gravity direction upon receiving a weight of the substrate W.

The base 130 supports the guide portion 111 and the second support portion 114. The guide portion 111 holds one end of the first support portion 113 and guides a movement of the first support portion 113 in a −Z direction (the gravity direction) while regulating the movement of the first support portion 113 in an XY direction (a direction intersecting with the gravity direction). A linear guide, spline, or the like can be used as the guide portion 111. The elastic portion 112 directly supports the first support portion 113 or indirectly supports the first support portion 113 through the guide portion 111. For example, the elastic portion 112 is disposed on a side of a back surface of the first support portion 113 (a surface of the first support portion 113 which is not a side of a holding surface that holds the substrate W). In the present embodiment, the elastic portion 112 is fixed to a back surface of an end of the first support portion 113 held by the guide portion 111. As the elastic portion 112, for example, springs made of austenitic stainless steel (SUS301, SUS304, and the like) can be used. In FIG. 2A, a two-dot chain line circle is the substrate W, and the first support portion 113 and the second support portion 114 support the substrate W from the back surface thereof. As shown in FIG. 2B, when the substrate W is not placed on the first support portion 113, the elastic portion 112 supports the first support portion 113 at a position that is higher than the second support portion 114.

As shown in FIG. 2B, the end of the first support portion 113 is fixed to the base 130. An exhaust flow path (a first exhaust flow path) P1 is provided in the base 130. A vacuum pump 132 (an exhaust unit) is provided at one end of the exhaust flow path P1. The vacuum pump 132 exhausts gas through an adsorption hole (an intake hole) 133 and the exhaust flow path P1. As a result, the back surface of the first support portion 113 is vacuum adsorbed. Pressure in the exhaust flow path P1 is measured by a pressure sensor 131. A difference between a measured value and atmospheric pressure (pressure around the substrate) indicates a magnitude of adsorption pressure. When the substrate W is not placed on the first support portion 113, the elastic portion 112 elastically supports the first support portion 113 so that the intake hole 133 is not closed to cover the intake hole 113 by the back surface of the first support portion 113. When the substrate W is placed on the first support portion 113, the first support portion 113 moves in the −Z direction (the gravity direction) by receiving the weight of the substrate W, and the first support portion 113 closes the intake hole 133. The second support portion 114 is disposed at a height that can support the substrate W from the back surface when the first support portion 113 comes down to a position that closes the adsorption hole (the intake hole) 133. Since the adsorption hole 133 is closed by the first support portion 113, the pressure of the exhaust flow path P1 changes. If the pressure of the exhaust flow path P1 sufficiently changes, the adsorption hole 133 may not be completely closed and some gaps may be formed.

Here, frictional resistance between the guide portion 111 and the first support portion 113 is determined so that the first support portion 113 moves in the −Z direction due to the weight of the substrate W, and is desirably, for example, a frictional resistance of 0.1 N or less. In accordance with the placement of the substrate W on the first support portion 113, elastic force of the elastic portion 112 is set as follows so that the first support portion 113 closes the other end of the exhaust flow path P1. That is, in a state before the substrate W is placed on the first support portion 113, the elastic force of the elastic portion 112 (the force given to the first support portion 113 in a +Z direction) is set to be larger than a weight of the first support portion 113 −force (frictional force) received by the first support portion 113 from the guide portion 111 in the +Z direction. Moreover, when the first support portion 113 is at the position that closes the intake hole 133, the elastic force of the elastic portion 112 is set to be equal to or less than the weight of the substrate W+the weight of the first support portion 113−force (the frictional force) received by the first support portion 113 from the guide portion 111 in the +Z direction.

An ultimate vacuum degree due to the vacuum pump 132 of the present embodiment is, for example, in a range of −50 kPa to −90 kPa at gauge pressure. The controller 400 controls the vacuum pump 132 and receives a result of measurement by the pressure sensor 131. The adsorption hole 133 is opened and the exhaust flow path P1 has atmospheric pressure if the first support portion 113 is not at a position to close the intake hole 133, and thus adsorption pressure obtained from the value measured by the pressure sensor 131 substantially becomes zero. If the first support portion 113 closes the intake hole 133, the pressure of the exhaust flow path P1 is reduced, and the pressure sensor 131 shows the adsorption pressure limited to the ultimate vacuum degree. The controller 400 compares a threshold value set in advance with the adsorption pressure obtained from the value measured by the pressure sensor 131, and determines a load presence state of the substrate W based on a result of the comparison. When controller 400 determines that the substrate W is present (the first support portion 113 holds the substrate W), the controller 400 controls the drive portion 120 and moves the holding portion 110 to a predetermined position. Here, the threshold value is an amount of change in the value (adsorption pressure) measured by the pressure sensor 131 before and after the first support portion 113 holds the substrate W. Specifically, in a case where the adsorption pressure obtained from the value measured by the pressure sensor 131 is equal to or greater than the threshold value, controller 400 determines that the first support portion 113 holds the substrate W, and in a case where the adsorption pressure is less than the threshold value, controller 400 determines that the first support portion 113 does not hold the substrate W.

Figure 3:
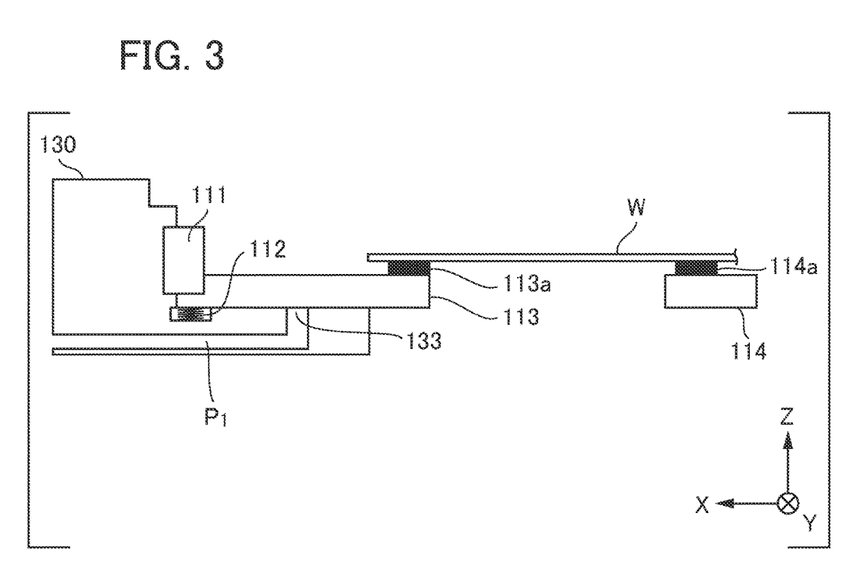
FIG. 3 is a diagram which shows a state in which a first support portion is at a position that closes the other end of a flow path.

FIG. 3 is a diagram which shows a state in which the first support portion 113 is at a position that closes the other end of the exhaust flow path P1. Hereinafter, illustration of the vacuum pump 132 and the pressure sensor 131 which have been shown in FIG. 2B is omitted. The holding of the substrate W according to the present embodiment is caused by the frictional force, not by the adsorption pressure, and thus, when the holding portion 110 is driven by the drive portion 120, it is desirable to provide a stopper so that the substrate W does not move or to suppress an acceleration of the drive. In addition, it is desirable that the first contact portion 113a and the second contact portion 114a be made by using appropriate materials with a high friction coefficient such as a polymer material, a resin, a rubber, a ceramic, and a metal to increase the frictional force.

Moreover, depending on the adsorption pressure by the vacuum pump 132 and the elastic force of the elastic portion 112, the first support portion 113 may not move in the +Z direction in some cases even though the substrate W is separated from the first support portion 113 after the substrate W is placed on the first support portion 113. In order to correspond to such a case, it is desirable to measure the adsorption pressure again by performing a stop of adsorption and a re-adsorption at a predetermined timing between a time at which the substrate W is placed on the first support portion 113 and, for example, a time at which the substrate W is transported to the pre-alignment unit 300. If the substrate W is separated from the first support portion 113, the first support portion 113 moves in the +Z direction and the adsorption pressure obtained from the value measured by the pressure sensor 131 becomes substantially zero by the stop of adsorption. At this time, the controller 400 may notify the first transport device 100 of an error and may also stop the transport.

The predetermined timing is, for example, a timing at which the holding portion 110 arrives at a transport destination, a timing at which the holding portion arrives at a predetermined position on a transport route, a timing at which a predetermined time elapses from a start of transport, and a timing at which the other predetermined operations are completed.

As is described above, changes in the adsorption pressure are detected by using a weight of a transport target and closing an adsorption hole with an object different from the transport target. That is, a transport device of the present embodiment detects a weight of the transport target on a support portion which supports the transport target using the adsorption pressure and determines the load presence state according to a result of the detection. Therefore, load presence detection accuracy is not affected by a shape (a concavity and a convexity, warpage, a hole, and the like) of the transport target. In addition, the present embodiment is advantageous in terms of cost, size, and the like as compared with a case of using an optical sensor, a contact-type sensor, and the like. According to the present embodiment, it is possible to provide a transport device capable of detecting the load presence state regardless of a shape of a substrate.

Moreover, a vacuum pump (not shown) of a different system from the vacuum pump 132 for exhausting the exhaust flow path P1 may be connected to the contact portion 114a to adsorb and hold the substrate W. If a change in the pressure of the exhaust flow path (not shown) connected to the contact portion 114a when the substrate W is placed thereon is small, a control to switch transport speeds may be performed so that a movement speed of the substrate W by the first transport device 100 is slower than a movement speed when the changes in the pressure of the exhaust flow path (not shown) are large. In the same manner, a control to switch acceleration may also be performed. As a result, even if the holding portion 110 cannot hold the substrate W with enough force due to warpage of the substrate W and a process of the substrate W, it is possible to reduce a possibility that the first transport device 100 drops the substrate W.

(Second Embodiment)

Figure 4A:
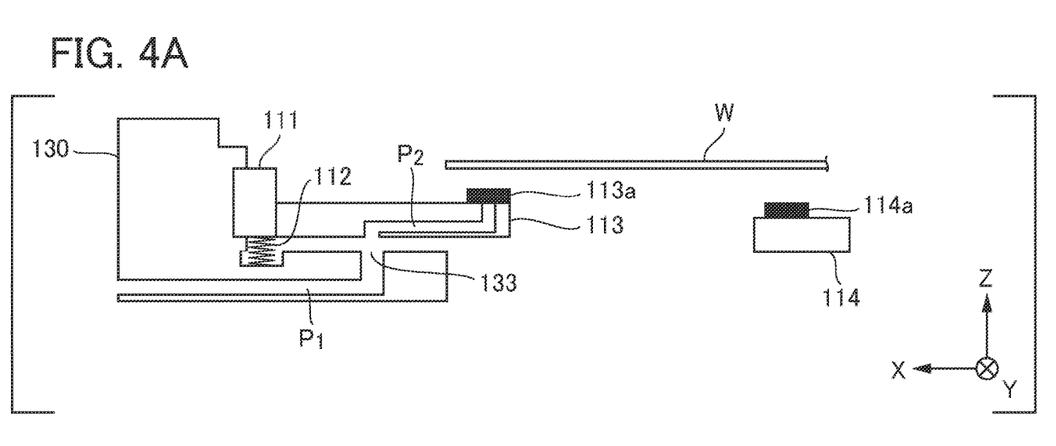
FIG. 4A is a schematic diagram which shows a transport device according to a second embodiment before a substrate is placed thereon.
Figure 4B:
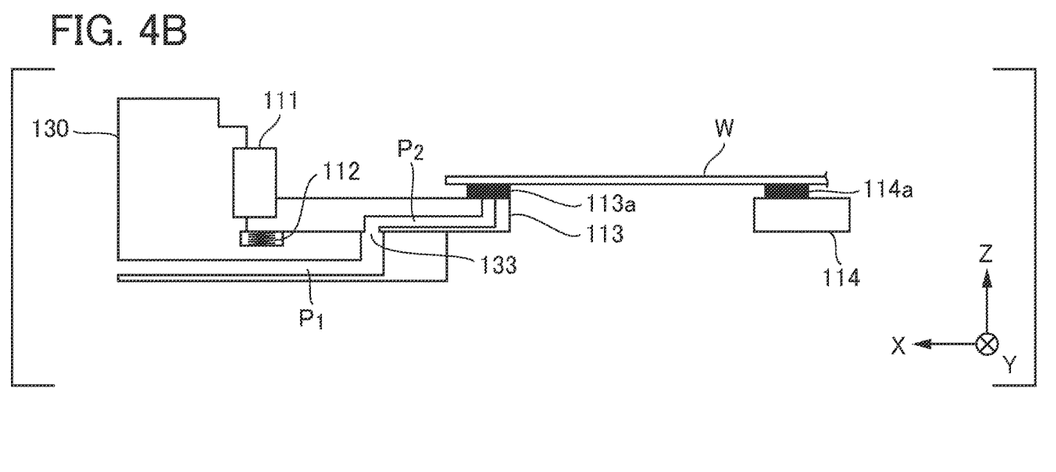
FIG. 4B is a schematic diagram which shows the transport device according to the second embodiment after a substrate is placed thereon.

FIGS. 4A and 4B are schematic diagrams which show a configuration of a transport device according to the present embodiment. FIG. 4A shows the transport device before the substrate W is placed thereon, and FIG. 4B shows the transport device after the substrate W is placed thereon. In the present embodiment, an exhaust flow path (a second exhaust flow path) P2 is provided in the first support portion 113, the first contact portion 113a is provided at one end of the exhaust flow path P2, and an exhaust hole is provided at the other end. A porous member having a large number of holes (through holes) is used as the first contact portion 113a, and the first contact portion 113a serves as an adsorption hole for vacuum adsorbing the substrate W. A pore diameter of the porous member may be arbitrarily selected. In addition, a material of the porous member may be a metal or a ceramic. A ceramic is preferred in a case of holding the substrate W for which metal contamination should be avoided. The exhaust flow path P2 is coupled to the porous member. The substrate W is placed on the first support portion 113, and thereby the first support portion 113 moves in the −Z direction and the exhaust flow path P1 and the exhaust flow path P2 communicate with each other.

The porous member obtains enough adsorption force to hold the substrate W even if adsorption is performed by some of the large number of holes included in the porous member depending on a pore diameter of the porous member. In addition, in a case of such a pore diameter, leakage of gas from a hole which does not adsorb the substrate W is generally less likely to occur. As a result, the exhaust flow path P1 and the exhaust flow path P2 communicate with each other, and thereby the adsorption hole 133 of the base 130 is closed by the first contact portion 113a through the exhaust flow path P2, and the exhaust flow path P1 and the exhaust flow path P2 are exhausted by the vacuum pump 132. Therefore, in the same manner as in the first embodiment, it is possible to determine the load presence state of the substrate W by monitoring the adsorption pressure measured by the pressure sensor 131 even in the preset embodiment.

In the transport device of the present embodiment, a holding force required for the first support portion 113 to hold the substrate W is also obtained by vacuum adsorption, and thus it is not necessary to provide a stopper which is necessary in the first embodiment or to suppress the acceleration of a drive. The transport device according to the present embodiment also shows the same effect as in the first embodiment.

(Third Embodiment)

Figure 5A:
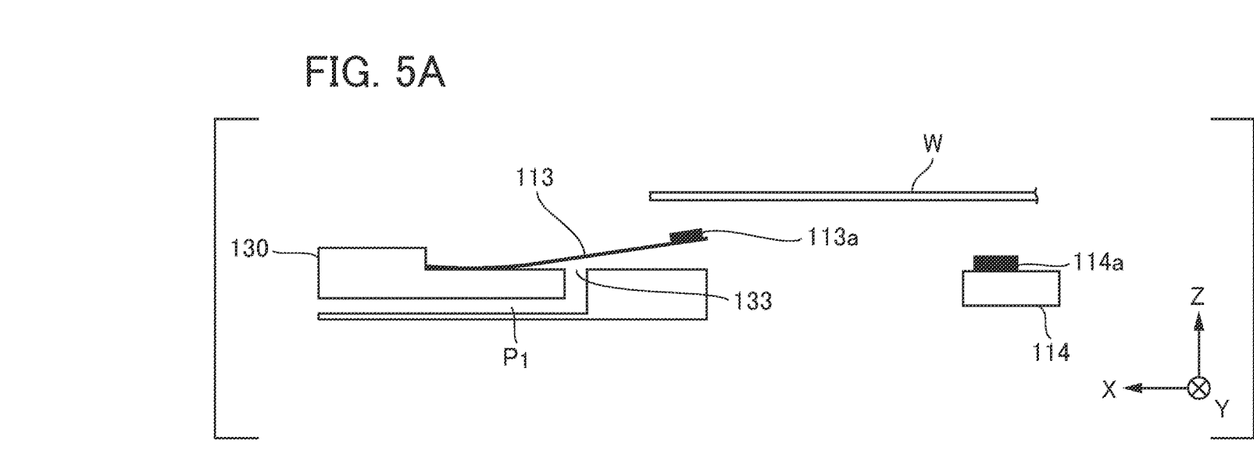
FIG. 5A is a schematic diagram which shows a transport device according to a third embodiment before a substrate is placed thereon.
Figure 5B:
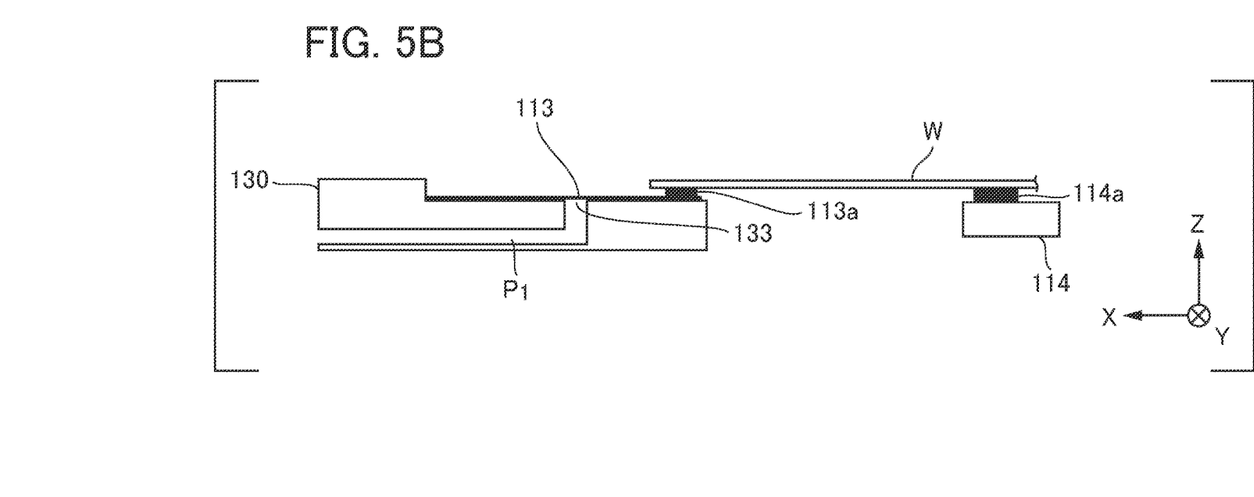
FIG. 5B is a schematic diagram which shows the transport device according to the third embodiment after a substrate is placed thereon.

FIGS. 5A and 5B are schematic diagrams which show a configuration of a transport device according to the present embodiment. FIG. 5A shows the transport device before the substrate W is placed thereon, and FIG. 5B shows the transport device after the substrate W is placed thereon. The present embodiment has a configuration in which the first support portion 113 is set as a plate spring, and the guide portion 111 and the elastic portion 112 are not included. The first support portion 113 has one end fixed to the base 130 and includes the first contact portion 113a at the other end. As shown in FIG. 5A, if the first support portion 113 is not at a position to close the intake hole 133, the first support portion 113 cannot be adsorbed, and thus the adsorption pressure obtained from the value measured by the pressure sensor 131 becomes substantially zero. On the other hand, as shown in FIG. 5B, if the substrate W is in contact with the first contact portion 113a, the first support portion 113 is elastically deformed to close the intake hole 133. Accordingly, the first support portion 113 is adsorbed and the pressure sensor 131 shows an adsorption pressure limited to the ultimate vacuum degree. The controller 400 sets an adsorption pressure when the substrate W is on the first support portion 113 as a threshold value, compares the adsorption pressure with the adsorption pressure obtained from the value measured by the pressure sensor 131, and determines the load presence state of the substrate W. The transport device of the present embodiment has no effect of friction due to a guide portion, and thus can also detect the load presence state of the substrate W which is too light to handle in the embodiments described above.

(Fourth Embodiment)

Figure 6A:
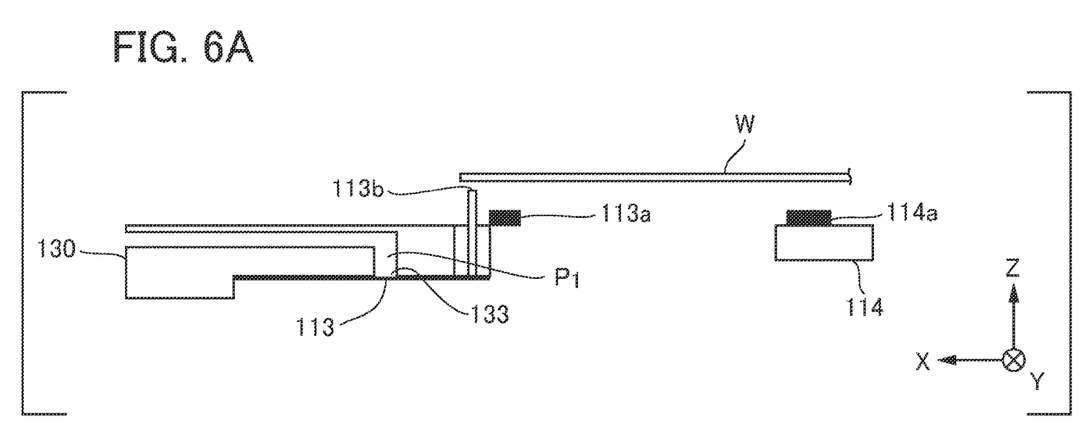
FIG. 6A is a schematic diagram which shows a transport device according to a fourth embodiment before a substrate is placed thereon.
Figure 6B:
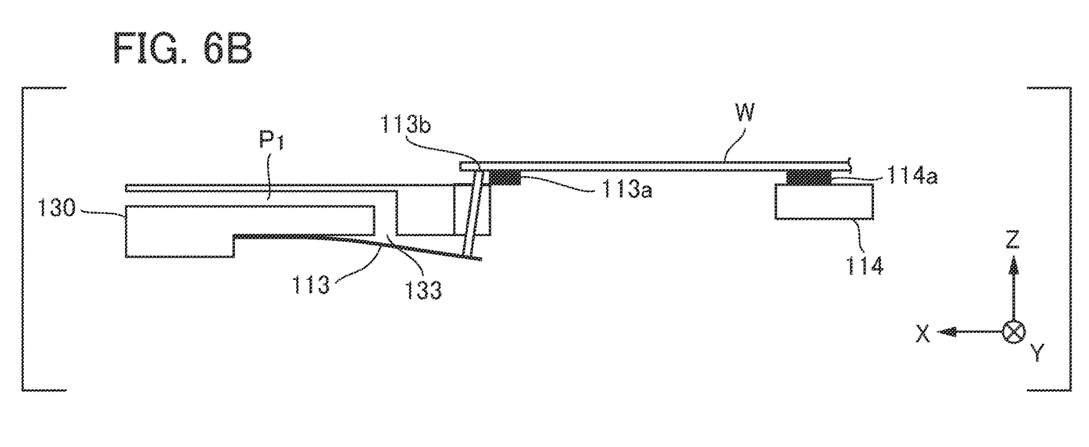
FIG. 6B is a schematic diagram which shows a transport device according to the fourth embodiment after a substrate is placed thereon.

FIGS. 6A and 6B are schematic diagrams which show a configuration of a transport device according to the present embodiment. FIG. 6A shows the transport device before the substrate W is placed thereon, and FIG. 6B shows the transport device after the substrate W is placed thereon. In the present embodiment, the first support portion 113 is set as a plate spring and a detection unit 113b is provided at a front end of the first support portion. Unlike the embodiments described above, in the present embodiment, an adsorption pressure is measured before the substrate W is placed on the first support portion 113, and the adsorption pressure is shown as substantially zero after the substrate W is placed o the first support portion 113. If the substrate W is placed on the first support portion 113, the detection unit 113b is pushed and moves in the −Z direction (the gravity direction), and thus the exhaust flow path P1 is opened to the atmosphere. The first contact portion 113a and the detection unit 113b may also be integrally configured. If the weight of the substrate W is light, it is desirable to stop vacuum adsorption once when the substrate W is mounted on the first support portion 113 and to check the adsorption pressure again after the substrate W is placed on the first support portion 113. The transport device according to the present embodiment also shows the same effect as in the first embodiment.

(Fifth Embodiment)

Figure 7A:
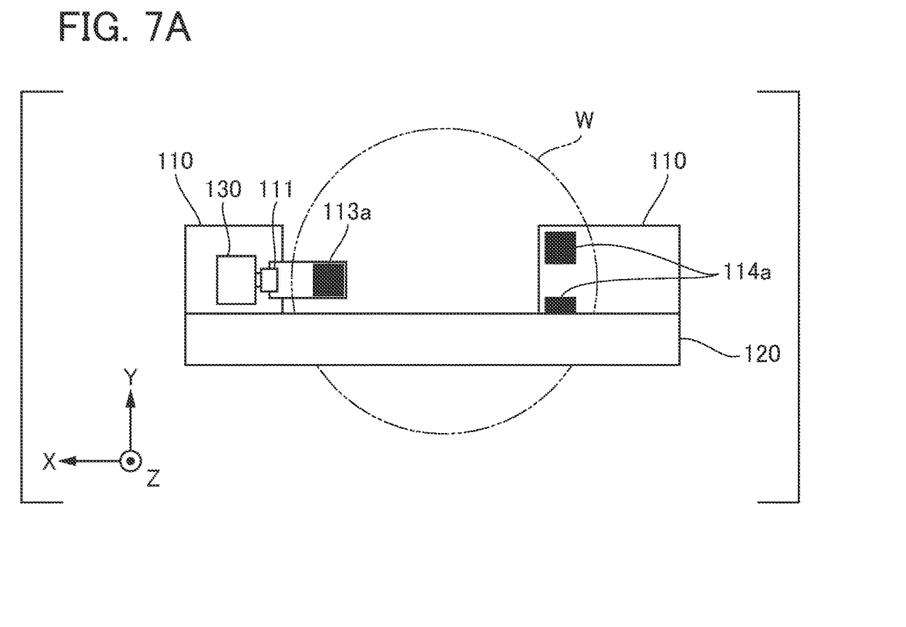
FIG. 7A is a schematic diagram of a transport device according to a fifth embodiment which is a view from an upper surface of a substrate (the Z direction).
Figure 7B:
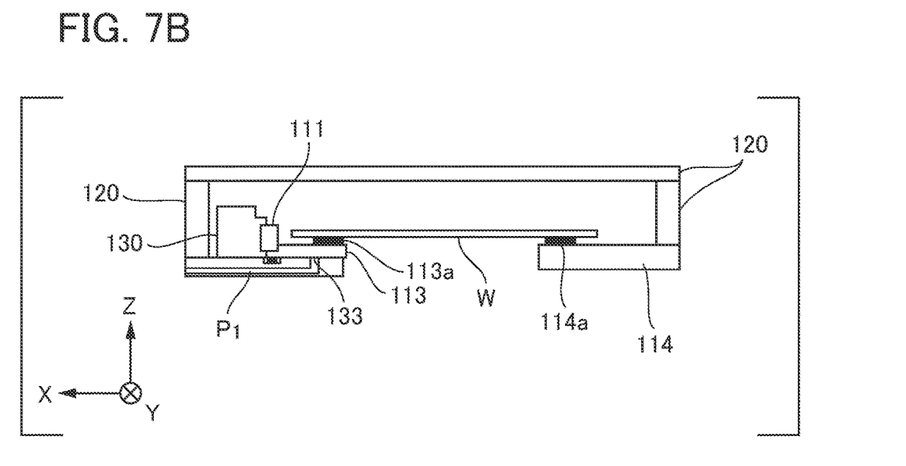
FIG. 7B is a schematic diagram of the transport device according to the fifth embodiment which is a view from a side surface of the substrate (the Y direction).

FIGS. 7A and 7B are schematic diagrams which show a configuration of a transport device according to the present embodiment. FIG. 7A is a diagram which is a view from the Z direction, and FIG. 7B is a diagram which is a view from the Y direction. In the present embodiment, a shape of the holding portion 110 is different from in the above embodiments. In addition, the drive portion 120 serves as a coupling rod for supporting the base 130 from above. The transport device according to the present embodiment also has the same effects as in the first embodiment.

In the above description, only the first support portion 113 is a member which moves downward as the substrate W is placed thereon, but the second support portion 114 may also be a member which is vertically movable. In addition, the transport target is not limited to the substrate, and may be other objects such as a mold (mold) and the like used in an imprint apparatus.

It is possible to use an lithographic apparatus which forms a latent image pattern of an original plate (reticle) on a substrate by exposing the substrate using light rays such as an i ray (wavelength 365 nm), ArF laser light (wavelength 193 nm), and EUV light (wavelength 13 nm) as the exposure apparatus. Moreover, it is possible to apply the transport system of the embodiments described above to other lithographic apparatuses such as a drawing apparatus for drawing a latent image pattern on a substrate by laser light or charged particle rays and an imprint apparatus for forming a pattern of a cured material on a substrate using a mold in which a three-dimensional pattern is formed.

(Article Manufacturing Method)

An article manufacturing method according to an embodiment of the present invention is preferred in manufacturing an article, for example, a micro device such as a semiconductor device or the like or an article such as an element having a microstructure. The article manufacturing method of the present embodiment may include a step of forming (exposing) a pattern on a substrate transported by the aforementioned transport device using the aforementioned exposure apparatus; and a step of processing (developing) the substrate on which the pattern has been formed in the previous step. If the lithographic apparatus is an imprint apparatus, the article manufacturing method includes, for example, a step of removing a residual film instead of the developing step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-109634, filed Jun. 1, 2016, which is hereby incorporated by reference wherein in its entirety.

What is claimed is:

1. A holding device which holds a substrate comprising:
   a base including a hole and an exhaust flow path communicating with the hole;
   a moving member configured to, in response to the substrate being disposed on the moving member, move downwardly in a gravity direction due to a weight of the substrate, the movement of the moving member downwardly in the gravity direction due to the weight of the substrate causing the moving member to contact the base and thereby cover the hole with a surface of the moving member; and
   a determination unit configured to determine whether the substrate is disposed on the moving member on the basis of a change in pressure of the exhaust flow path exhausted by an exhaust unit, the change in pressure of the exhaust flow path having been caused by the movement of the moving member downwardly in the gravity direction due to the weight of the substrate disposed on the moving member.

2. The holding device according to claim 1, wherein the moving member is configured to close or open the hole disposed in the gravity direction to the moving member.

3. The holding device according to claim 2, wherein the exhaust flow path is a first exhaust flow path, the moving member includes a porous member which is provided at a portion that holds the substrate and has a plurality of holes, and a second exhaust flow path which communicates with the porous member, and the first exhaust flow path and the second exhaust flow path communicate with each other due to the movement of the moving member downwardly in the gravity direction, and the first exhaust flow path and the second exhaust flow path are exhausted by the exhaust unit, and thereby the moving member adsorbs the substrate via the porous member.

4. The holding device according to claim 2, further comprising an elastic portion which is disposed on a side of the moving member of the base and supports the moving member, wherein the elastic portion supports the moving member so that the moving member does not close the hole before the moving member comes into contact with the substrate, and supports the moving member so that the moving member closes the hole by the moving member contacting the substrate.

5. The holding device according to claim 1, wherein the moving member opens the hole which has been closed by moving in the gravity direction.

6. The holding device according to claim 1, wherein the determination unit compares an amount of change in the pressure with a threshold value, determines that the substrate is disposed on the moving member in a case where the amount of change in the pressure is equal to or greater than the threshold value, and determines that the substrate is not disposed on the moving member in a case where the amount of change in the pressure is less than the threshold value.

7. The holding device according to claim 1, wherein the moving member is a plate spring configured to have one end fixed to the base and the other end contactable by an object, and is elastically deformed due to the weight of the substrate.

8. The holding device according to claim 1, wherein a guide portion which guides the movement of the moving member downwardly in the gravity direction while regulating the movement of the moving member in a direction intersecting with the gravity direction is disposed on the base.

9. The holding device according to claim 1, wherein the moving member is configured to close the hole while the substrate is disposed on the moving member and open the hole while the substrate is not disposed on the moving member.

10. The holding device according to claim 1, further comprising:
a support portion upon which the substrate is also disposed in a case where the substrate is disposed on the moving member,
wherein in a case where the substrate is not disposed on the moving member and the support portion, the moving member is disposed at a first height in the gravity direction, and the support portion is disposed at a second height in the gravity direction that is lower than the first height in the gravity direction.

11. The holding device according to claim 1, further comprising:
another exhaust flow path disposed in the moving member,
wherein in a case where the substrate is not disposed on the moving member, the exhaust flow path included in the base and the another exhaust flow path included in the moving member are separated from each other by a gap between the base and the moving member, and
wherein in a case where the substrate is disposed on the moving member such that the moving member moves downwardly in the gravity direction due to the weight of the substrate and contacts the base, thereby eliminating the gap between the base and the moving member, the exhaust flow path included in the base and the another exhaust flow path included in the moving member directly communicate with each other.

12. The holding device according to claim 1, wherein the moving member has a fixed end that is fixed to the base and a moveable end configured to receive the substrate,
wherein in a case where the substrate is not disposed on the moveable end of the moving member, the moveable end of the moving member is separated from the base by a gap between the base and the moveable end of the moving member, and
wherein in a case where the substrate is disposed on the moveable end of the moving member such that the moveable end of the moving member moves downwardly in the gravity direction due to the weight of the substrate and contacts the base, the gap between the base and the moveable end of the moving member is eliminated.

13. A transport device comprising:
a drive portion which drives a holding device configured to hold a substrate;
a controller which controls the drive portion;
wherein the holding device comprises:
a base including a hole and an exhaust flow path communicating with the hole;
a moving member configured to, in response to the substrate being disposed on the moving member, move downwardly in a gravity direction due to a weight of the substrate, the movement of the moving member downwardly in the gravity direction due to the weight of the substrate causing the moving member to contact the base and thereby cover the hole with a surface of the moving member; and
a determination unit configured to determine whether the substrate is disposed on the moving member on the basis of a change in pressure of the exhaust flow path exhausted by an exhaust unit, the change in pressure of the exhaust flow path having been caused by the movement of the moving member downwardly in the gravity direction due to the weight of the substrate disposed on the moving member; and
wherein the controller controls the drive portion on the basis of a result of the determination by the determination unit.

14. The transport device according to claim 13, wherein the controller stops exhaustion by the exhaust unit at a predetermined timing, and the determination unit performs the determination on the basis of comparison between an amount of change in the pressure when the exhausting is stopped and a threshold value.

15. A lithographic apparatus which forms patterns on a substrate, the lithographic apparatus comprising:
   a transport device configured to transport the substrate, wherein the transport device comprises:
   a drive portion which drives a holding device configured to hold a substrate;
   a controller which controls the drive portion;
   wherein the holding device comprises:
   a base including a hole and an exhaust flow path communicating with the hole;
   a moving member configured to, in response to the substrate being disposed on the moving member, move downwardly in a gravity direction due to a weight of the substrate, the movement of the moving member downwardly in the gravity direction due to the weight of the substrate causing the moving member to contact the base and thereby cover the hole with a surface of the moving member; and
   a determination unit configured to determine whether the substrate is disposed on the moving member on the basis of a change in pressure of the exhaust flow path exhausted by an exhaust unit, the change in pressure of the exhaust flow path having been caused by the movement of the moving member downwardly in the gravity direction due to the weight of the substrate disposed on the moving member; and
   wherein the controller controls the drive portion on the basis of a result of the determination by the determination unit.

16. A method for manufacturing an article, the method comprising steps of:
   forming patterns on a substrate using a lithographic apparatus; and
   processing the substrate on which patterns are formed in the forming to manufacture an article,
   wherein the lithographic apparatus includes a holding device for holding the substrate and a transport device,
   the holding device includes
   a base including a hole and an exhaust flow path which communicates with the hole,
   a moving member configured to, in response to the substrate being disposed on the moving member, move downwardly in a gravity direction due to a weight of the substrate, the movement of the moving member downwardly in the gravity direction due to the weight of the substrate causing the moving member to contact the base and thereby cover the hole with a surface of the moving member, and
   a determination unit configured to determine whether the substrate is disposed on the moving member on the basis of a change in pressure of the exhaust flow path exhausted by an exhaust unit, the change in pressure of the exhaust flow path having been caused by the movement of the moving member downwardly in the gravity direction due to the weight of the substrate disposed on the moving member, and
   the transport device includes a drive portion for driving the holding device and a controller for controlling the drive portion on the basis of a result of the determination by the determination unit.

* * * * *